United States Patent [19]

Nelson et al.

[11] 4,295,988
[45] Oct. 20, 1981

[54] MAGNETO-OPTIC $BI_1 LU_2 FE_5O_{12}$ CRYSTALS

[75] Inventors: Gary L. Nelson, Eagan; William A. Harvey, Minneapolis, both of Minn.

[73] Assignee: Sperry Corporation, New York, N.Y.

[21] Appl. No.: 58,710

[22] Filed: Jul. 18, 1979

[51] Int. Cl.$^3$ .............................................. C30B 29/28
[52] U.S. Cl. .................................. 252/584; 156/621; 156/624
[58] Field of Search ................. 252/300; 156/621, 624

[56] References Cited
PUBLICATIONS

Kestigian, M. et al., "Substituted Rare Earth Garnet Substrate Crystals...", *J. Cryst. Growth* 42 (1977), pp. 343–344.

Johansen et al., "Magneto-Optic Development for Laser Beam Steering", *Chem. Abs.*, vol. 88, (1978), #30107z.

Grodkiewicz et al., "Growth of Large Ytthrium and Rare-Earth Aluminum and Iron Garnets", *J. Phys. Chem. Solids, Suppl. No. 1*, (1967), pp. 441–444.

*Primary Examiner*—Deborah L. Kyle
*Attorney, Agent, or Firm*—Douglas L. Tschida; Kenneth T. Grace; William E. Cleaver

[57] ABSTRACT

A mixture and method are disclosed for growing bismuth lutetium iron garnet crystals via liquid phase epitaxy on a gadolinium gallium garnet (GGG) substrate wherein the crystals exhibit a relatively high Faraday rotation and an improved optical absorption.

2 Claims, 2 Drawing Figures

MAGNETO-OPTIC $Bi_1 Lu_2 Fe_5O_{12}$ CRYSTALS

BACKGROUND OF THE INVENTION

The present invention relates to bismuth substituted iron garnet crystals for use in magneto-optic light deflection systems, such as described in U.S. Pat. No. 3,752,563, and more specifically to bismuth substituted iron garnet crystals having large values of Faraday rotation (F) and low coefficients of optical absorption ($\alpha$). In previously filed applications Ser. No.'s 817,754, now abandoned, and 954,511, assigned to the present assignee, a melt solvent and a rinse melt are described for growing mechanically superior crystals. While previous work has produced crystals having relatively large Faraday rotations by promoting bismuth substitutions in the garnet's lattice such as suggested in the articles of Hiroshi Takeuchi, et al., J. Appl. Phys., Vol. 44, No. 4789 (1973); D. E. Lacklison, et al., Solid State Commun., Vol. 14, 861 (1974); and U.S. Pat. No. 4,092,208 issued to Brice, et al., the optical absorption qualities of the bismuth substituted crystals in the near-infrared region (0.70 to 1.60 microns) have been relatively uncontrolled.

Single crystal work done by D. L. Wood, et al., with calcium doped yttrium iron garnet (YIG), J. Appl. Physics, Vol. 38, No. 3, 1038 (1967), and J. Appl. Physics, Vol. 37, No. 3, 1232 (1966) suggests that introduction of calcium $Ca^{2+}$ and silicon $Si^{4+}$ into a YIG garnet melt with a $PbO-B_2O_3$ flux can affect the $\alpha$ of the single crystal depending on the concentration of $Ca^{2+}$ and that the minimum $\alpha$ can be shifted by adding $Si^{4+}$ to the melt. The present invention, however, teaches that an improved bismuth substituted iron garnet crystal can be grown on a GGG substrate by combining Lutetium ($Lu^{3+}$) and calcium ($Ca^{2+}$) in a melt containing a lead oxide (PbO) bismuth oxide ($Bi_2O_3$) flux, thus promoting bismuth substitution and enabling a low growth temperature, to obtain a deflector crystal having a high Faraday rotation and a relatively low optical absorption coefficieht $\alpha$.

It is therefore an object of the present invention to grow crystals from a melt containing bismuth oxide to enable substitution and a high Faraday rotation.

It is a further object to grow crystals on a substrate from a melt containing lead oxide to enable a low growth temperature and still reduce the optical absorption of the crystals.

SUMMARY OF THE INVENTION

A melt mixture and method for growing bismuth substituted iron garnet crystals having large values of Faraday rotation and minimum values of optical absorption is disclosed. The melt mixture is comprised of lead oxide (PbO), bismuth oxide ($Bi_2O_3$), iron oxide ($Fe_2O_3$) and lutetium oxide ($Lu_2O_3$) in combination with calcium oxide (CaO). Crystals grown with this mixture at 20% concentration of CaO to $Lu_2O_3$ at approximately 700° C. on a gadolinium gallium garnet (GGG) substrate via liquid phase epitaxy have demonstrated an optical absorption on the order of 20 dB/cm at 1.06 microns and a Faraday rotation of 16,000°/cm at 6328 Å at room temperature.

DESCRIPTION OF THE PREFERRED EMBODIMENT

In order to maximize the efficiency of a magneto-optic deflector, it is necessary to maximize the first order component of the deflected light. The first order term can be represented by the equation $$I_1 = 0.81 \, I_0 e^{-\alpha t} \sin^2(Ft)$$

where: $I_0$ = incident light
$I_1$ = first order component of the reflected light
$\alpha$ = coefficient of absorption of the iron garnet crystal
F = coefficient of Faraday rotation of the iron garnet crystal
t = thickness of the iron garnet crystal The deflected light will be a maximum when the term (Ft) is 90° and $e^{-\alpha t}$ is 1 and thus it is desirable to grow iron garnet deflector crystals having a large F and a small $\alpha$. The epitaxial garnet crystals, however, are grown to thicknesses measured in microns, and it is thus necessary to support the garnet crystals on a substrate. The substrate, because it is within the optical path of the deflector crystal, must be transparent at the same wavelengths as the deflector crystal and must also be non-magnetic. A suitable material exhibiting these properties which is used as the substrate for the present crystals is a $Gd_3Ga_5O_{12}$ garnet (GGG). The GGG substrate, however, has a lattice constant of 12.380 Å and thus the deflector crystal is constrained to have a similar lattice constant.

The relatively small lattice size required of the deflector crystal, however, presents mechanical and chemical constraints not experienced when growing single crystals. In order to produce deflector crystals that are strain free, it is necessary to match the substrate lattice within approximately 0.005 Å which precludes the use of the calcium vanadium bismuth garnet (i.e., approximately 12.500 Å lattice) and the shifting of the absorption peaks by increasing the lattice as suggested by Wood, et al. For deflector crystals it is desired to maximize the bismuth substitution and consequential Faraday rotation, which is achieved with a low growth temperature, and at the same time minimize the absorption at 1.06 microns. The present melt enables these ends with the growth of crystals at the lower $PbO$-$Bi_2O_3$ flux temperatures, with the higher bismuth substitution and Faraday rotation, and without the large values of optical absorption referred to by Brice, et al.

Figure 1:
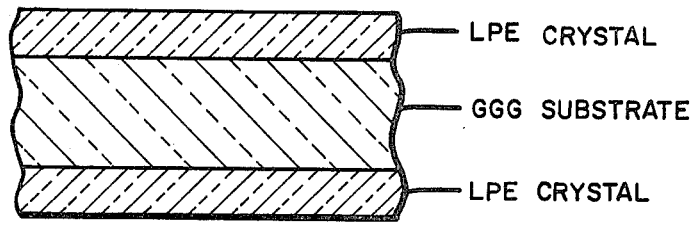
FIG. 1 is a cross-sectional representation of a GGG garnet substrate with a $Bi Lu_2 Fe_5O_{12}$ crystal grown by liquid phase epitaxy on its upper and lower surfaces.

Referring to FIG. 1, the improved crystals are grown in the following manner and sequence of steps: (1) a melt mixture (see Table I) is prepared and heated in a platinum crucible in a clean environment to a temperature on the order to 200° C. above the melt's growth temperature; (2) the melt is then cooled to the primary melt growth temperature (i.e., approximately 700° C., but this may vary between 680° to 800° C. depending on the concentrations of the mixture's constituents); (3) a GGG substrate is preheated to a temperature on the order of the melt growth temperature and is immersed in the melt; (4) the substrate is rotated during the growth period until a crystal of the desired thickness is grown; (5) the crystal-substrate combination is withdrawn from the melt and the combination, while still at a temperature very closely approximating the growth temperature, is spun to remove any of the primary melt residue adhering to the crystal; and (6) the crystal-substrate combination is allowed to cool to room temperature, after which it is submitted to mechanical processing, such as etching the crystal from one surface of the combination, to prepare the crystal for use in a deflection system.

TABLE I

| Constituent | Concentration |
|---|---|
| PbO | 1000.00 m mole |
| $Bi_2O_3$ | 395.26 m mole |
| $Fe_2O_3$ | 142.73 m mole |
| $Lu_2O_3$ | 7.57 m mole |
| CaO | 1.52 m mole |

Figure 2:
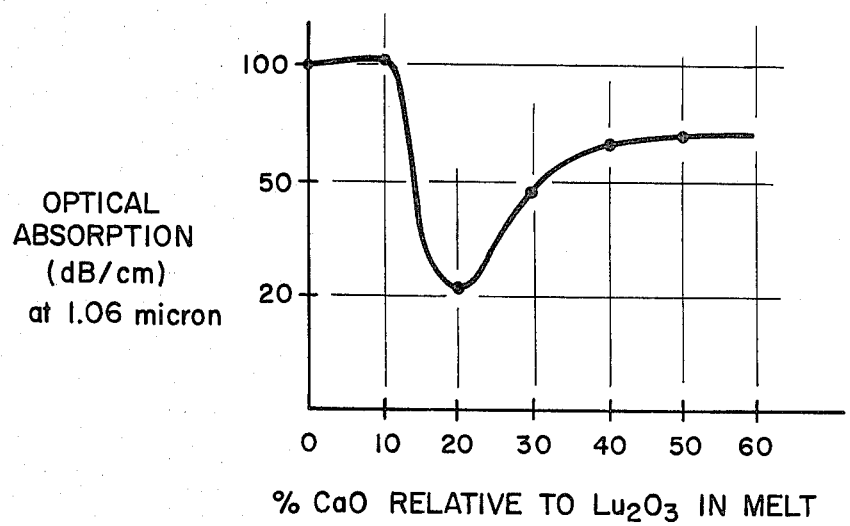
FIG. 2 is a graphical representation of the effect on optical absorption as the concentration of CaO is varied with respect to the concentration of $Lu_2O_3$ in the primary melt.

Referring to FIG. 2 and Table II, several crystals were grown from a number of melt compositions containing the constituents of Table I in which the concentration of calcium oxide was varied in relation to that of the lutetium oxide. From these crystals it was observed that at approximately a twenty percent concentration of calcium oxide to lutetium oxide, an optimum Faraday rotation of 16,900°/cm at 6328 Å and a minimum optical absorption of 20 dB/cm at 1.06 microns were achieved. These values represent an improvement over similar bismuth lutetium crystals grown in a similar manner without CaO doping which crystals exhibited Faraday rotations at 6328 Å from 1400° to 1600°/cm and absorption values at 1.06 microns of 80 to 200 dB/cm.

TABLE II

| % Concentration of CaO to $Lu_2O_3$ | Faraday Rotation (°/cm) at 6328Å |
|---|---|
| 10 | 14,700 |
| 20 | 16,900 |
| 30 | 14,800 |
| 40 | 12,700 |
| 50 | 13,100 |

It is to be recognized that while the present invention has been described with reference to the mixture of Table I and the CaO concentration ratios of Table II, several other mixtures, wherein the ratios of the other melt constituents are varied, are possible without departing from the spirit of the disclosure. Representative ranges of molar ratios for the flux, iron and rare earth constituents follow in Table III. It is to be further recognized in the ranges of Table III the concentration of CaO to $Lu_2O_3$ would also vary with the minimum absorption point having to be ascertained in the manner of FIG. 2, but which minimum would probably appear within the indicated range.

TABLE III

| Ratio | Range |
|---|---|
| $\dfrac{Bi_2O_3}{Bi_2O_3 + PbO}$ | .20 to .40 |
| $\dfrac{Fe_2O_3}{Bi_2O_3 + PbO + Fe_2O_3}$ | .07 to .13 |
| $\dfrac{Lu_2O_3}{Fe_2O_3 + Lu_2O_3}$ | .030 to .080 |
| $\dfrac{CaO}{Lu_2O_3}$ | .05 to .40 |

What is claimed is:

1. A mixture for growing a $Bi_1Lu_2Fe_5O_{12}$ garnet crystal on a $Gd_3Ga_5O_{12}$ garnet substrate in a liquid phase eptiaxial process, said mixture consisting essentially of PbO, $Bi_2O_3$, $Fe_2O_3$, $Lu_2O_3$ and CaO in concentrations sufficient to grow said $Bi_1Lu_2Fe_5O_{12}$ garnet crystal and the latter CaO in a concentration such that the molar ratio of CaO to $Lu_2O_3$ is in the range of 0.05 to 0.40.

2. A mixture for growing a $Bi_1 Lu_2 Fe_5O_{12}$ garnet crystal on a $Gd_3Ga_5O_{12}$ garnet substrate in a liquid phase epitaxial process at a growth temperature between 680° to 800° C., said mixture consisting essentially of PbO, $Bi_2O_3$, $Fe_2O_3$, $Lu_2O_3$ and CaO in the relative molar ratio ranges of

| | |
|---|---|
| $\dfrac{Bi_2O_3}{Bi_2O_3 + PbO}$ | between .20 to .40, |
| $\dfrac{Fe_2O_3}{Bi_2O_3 + PbO + Fe_2O_3}$ | between .07 to .13, |
| $\dfrac{Lu_2O_3}{Fe_2O_3 + Lu_2O_3}$ | between .030 to .080 and |
| $\dfrac{CaO}{Lu_2O_3}$ | between .05 to .40. |

* * * * *